(12) United States Patent
Khalid et al.

(10) Patent No.: US 10,178,772 B2
(45) Date of Patent: Jan. 8, 2019

(54) CONTROLLABLE CONSTANT CURRENT SUPPLY INTEGRATED CIRCUITS FOR DRIVING DENSE ARRAYS

(71) Applicant: 4233999 CANADA INC., Westmount (CA)

(72) Inventors: Najeeb Ashraf Khalid, Westmount (CA); Maksymilian Wulkan, Westmount (CA)

(73) Assignee: 4233999 CANADA INC., Westmount, QC (CA)

( * ) Notice: Subject to any disclaimer, the term of this patent is extended or adjusted under 35 U.S.C. 154(b) by 338 days.

(21) Appl. No.: 14/906,718

(22) PCT Filed: Jul. 24, 2014

(86) PCT No.: PCT/CA2014/050701
§ 371 (c)(1),
(2) Date: Jan. 21, 2016

(87) PCT Pub. No.: WO2015/010211
PCT Pub. Date: Jan. 29, 2015

(65) Prior Publication Data
US 2016/0165734 A1 Jun. 9, 2016

Related U.S. Application Data

(60) Provisional application No. 61/857,745, filed on Jul. 24, 2013.

(51) Int. Cl.
*B41J 2/45* (2006.01)
*H03K 3/00* (2006.01)
(Continued)

(52) U.S. Cl.
CPC .............. *H05K 3/0023* (2013.01); *B41J 2/45* (2013.01); *H05B 33/086* (2013.01); *H05B 33/0845* (2013.01)

(58) Field of Classification Search
CPC .......................................................... B41J 2/45
See application file for complete search history.

(56) References Cited

U.S. PATENT DOCUMENTS 4,885,597 A 12/1989 Tschang et al.
5,017,979 A 5/1991 Fujii et al.
(Continued)

OTHER PUBLICATIONS

PCT/CA2014/050701 international preliminary report with related claims.
(Continued)

*Primary Examiner* — Julian D Huffman
(74) *Attorney, Agent, or Firm* — Anglehart et al.

(57) ABSTRACT

A controllable current driver integrated circuit is provided. The controllable current driver includes a multitude of different current value output transistors digitally controlled and combined to provide a controllable current output. The different current value transistors are each provided as single lithographic devices on a same substrate in proximity to each other having weighted drain and source areas corresponding to the different current values. The weighted drivers reduce the implementation area required on the semiconductor die for decoding and driving the output transistors substantially increasing the density of current drivers which can be integrated in one semiconductor die.

19 Claims, 5 Drawing Sheets

(51) Int. Cl.
  *H05B 33/08*    (2006.01)
  *H05K 3/00*     (2006.01)

(56) References Cited

U.S. PATENT DOCUMENTS

| | | |
|---|---|---|
| 5,257,039 A | 10/1993 | Chung et al. |
| 7,157,895 B2 | 1/2007 | Naffziger et al. |
| 2009/0110015 A1* | 4/2009 | Heink .................... B41J 2/473 |
| | | 372/38.02 |

OTHER PUBLICATIONS

PCT/CA2014/050701 international search report.
PCT/CA2014/050701 search strategy.
PCT/CA2014/050701 Written Opinion.

* cited by examiner

CONTROLLABLE CONSTANT CURRENT SUPPLY INTEGRATED CIRCUITS FOR DRIVING DENSE ARRAYS

REFERENCE TO RELATED APPLICATIONS

This application is a non-provisional of, and claims priority from, U.S. Provisional Patent Application 61/857,745 entitled "Binary Weighted Drivers" filed Jul. 24, 2013, the entirety of which is incorporated herein by reference.

TECHNICAL FIELD

The present application relates to electronic circuits, and more particularly to controllable constant current supply integrated circuits.

BACKGROUND

In the field of electronics, specific drive currents and drive voltages are required to drive electronic components in a variety of devices. Certain electronic devices require controllable constant current sources for them to provide the functionality desired.

Drive voltages and drive currents are higher, by many factors of magnitude, compared to the voltages and currents employed within integrated circuits for providing component control logic. For example, integrated circuits employ 1.8V and currents in the range of micro and pica amps to drive logic gates, while individual controlled components require voltages up to hundreds of volts (for example 90V are required by ink jet nozzles to operate) and currents in the range of ~1 to 100 mA. Very often the number of components to be driven in an overall device requires combined currents in the range of amps. The circuit implementation area of a driver circuit increases as the drive current (and the drive voltage) increases. Large driving currents make it impossible to have a high density of driving circuits in one integrated circuit to control multiple components.

It is also desirable in many applications to finely control the amount of drive current delivered to each component. High current control resolution further limits the number of component control drivers that can be accommodated within an integrated circuit die area.

The present wisdom in the art provides for an array of transistors in parallel that can be switched on in any combinations to provide a current that is the sum of all the transistors that are turned on. Such circuits being referred to as Digital to Analog Controller (DAC) as the output current is a reflection of binary inputs.

An alternate circuit often used to provide variable control of electronic and electrical devices is the Pulse Width Modulation (PWM) circuit. Here the current is not a variable but the duty cycle is. The current is switched on at a high rate for variable time thus providing variable energy to the device being driven. A digital version of this PWM circuit is known as DPWM. In a DPWM circuit a clock external to the circuit is provided to two counters. First counter counts to form a pulse clock that determines the maximum time for the pulse. The second counter counts down the count of the pulse width provided by digital inputs. The number of bits represents the resolution of the control circuit. Therefore the number of pulses (per unit time) is determined by the first counter and the duration of the pulses is controlled by the second counter. The energy provided to the electronic or electrical device being driven is the integral over time of the current pulses.

Despite providing good current control resolution, employing large arrays of transistors drivers increases the circuit area of the integrated circuit current driver due to the need for a decoder and additional control traces to activate transistors in the transistor array. This means that both miniaturization and high control resolution cannot be achieved together.

The state of the art provides for an array of unit driver transistors in parallel, combinations of which can be switched on to provide a drive current that is the sum of the currents provided by all transistors turned on. Such current driver circuits are referred to as Digital-to-Analog Converter (DAC) as the output current is a reflection of a number of binary inputs.

An alternate driver circuit, often used to provide variable control of electronic and electrical devices, is the Pulse Width Modulation (PWM) circuit. PWM provide a constant output current however with a variable duty cycle. The output current is switched on at a high rate for variable time periods thus providing a variable amount of energy to the device being driven. In a "Digital" PWM (DPWM) circuit version, a clock external to the circuit is provided to increment two counters. A first counter counts the duration of a pulse clock which determines the maximum duration for each pulse in clock cycles. A second counter counts down the duration of the pulse width specified via the digital inputs. The number of digital input bits represents the resolution of the DPWM drive circuit. Therefore the number of pulses per unit time (repetition rate) is determined by the first counter and the duration each pulse is controlled by the second counter, where the amount of energy provided to the electronic or electrical component/device being driven is the integral over time of the constant current pulses.

Generally, component current drive for example with a current control resolution of $\frac{1}{2^n}$, requires 256 different current control values for n=8. A logic control circuit will require an 8 bit register to drive a corresponding component. Implementing a typical component current driver using "unit current drivers" requires a multilevel decoder to decode the 8 bits to provide individual unit current driver control lines to enable each unit current driver to output the appropriate current. This approach requires 256 transistors to implement all unit current drivers and approximately 8000 gates in the decoder and the 8 bit register. Not only is the number of gates very large, the interconnection of these gates also requires a large implementation area on an integrated circuit semiconductor substrate.

Alternatively, the PWM approach requires counters, gates and corresponding interconnection, however only a single additional transistor at the output, the transistor being rated for maximum current. The number of gates used in this alternate approach is less than the above solution, but PWM suffers from noise due to high level of switching required to achieve the PWM function and makes PWM circuits costly, difficult to design and fabricate.

Therefore the implementation of either of the above circuits in semiconductor integrated circuits undesirably requires a substantial implementation area on a semiconductor wafer thereby limiting the number of such drivers which can be contained in a given semiconductor die size.

The size of the die may be constrained by other factors such as the wafer level fabrication technology used, the pattern of the connections of the driven device and material constraints. For a given wafer level fabrication technology, the size of the circuit implementation area required depends largely on three factors: maximum output voltage, maximum current and resolution of current control. The maximum output voltage determines the size of a gap required between integrated circuit conducting features and circuit traces to avoid arcing therebetween. The maximum current defines the width of the circuit traces as the height of the circuit traces is limited by metal deposition technologies. These two factors are governed by natural properties of materials employed in wafer level fabrication and cannot be changed. The third factor is determined by device design requirements. If a device to be driven by the current driver circuit requires only a few levels of control, then the number of digital input control bits required is low. If the device requires higher resolution of control, then the number of digital input control bits required is high. For example, four level temperature control requires only 2 control bits, whereas a 1% control resolution will require 8 control bits. The number of control bits may grow slowly with control resolution, but the complexity of the implementation in electronic circuits increases by more than the power of 2, i.e. logarithmically, imposing severe constraints on the density of control circuits which can be implemented on one integrated circuit die of a particular size. As a general rule, this constraint is inherent to the two prior art control methods described above.

In particular, the density of connectivity of logic circuit components on an integrated circuit semiconductor die is a problem. As the number of control bits grows, the connectivity grows logarithmically. For example, employing the DAC unit driver transistor array with $2^n$ parallel transistors described hereinabove, requires decoding of the n bit input into $2^n$ individual transistor control bits to switch the transistors. The required decoding circuit not only increases in complexity logarithmically, but the implementation also requires increasing levels of logic control. The logic control levels increase due to the limitation of individual gates in the circuit to drive subsequent gates; this is referred to as "fan out". Fan out of a given technology is limited. The higher the control resolution, the greater the decoding logic levels required. Similarly, employing a DPWM circuit to provide control of electronic or electrical components/devices, increasing number of bits which are fed into the two counters (or voltage controlled pulse width generators) to generate pulses of predetermined frequency but varying pulse widths (duty cycles) limits the connectivity density. The number of transistors required to implement this circuit is also large and grows larger with the increase in the control resolution required but not logarithmically. Therefore, the density of driver circuits which can be integrated into a given semiconductor die area is limited and is independent of the technology used to implement such circuits.

To appreciate the complexity of the digital circuits and therefore the semiconductor die area required for implementation of such circuits, it is advantageous to understand the reasons behind this fact.

The cell area of a decoder circuit is proportional to $n^3$, where n is the digital number whose inverse is the resolution of control required. Furthermore, the complexity of digital circuits is defined by two terms C and D, where C is the circuit size measured in number of inverters (NOR and NOT gates) and D is the circuit depth. For example, with reference to John Savage, "Models of Computation", Addison-Wesley, 1998, for n, the number of digital inputs (resolution):

$C(f_n) \leq 2C(f_{n/2}) + 2n$, where $C(f_{n/2}) \leq (2n-1)2^n$ and $D(f_n) \leq 2D(f_{n/2}) + 1$, where $D(f_{n/2}) \leq [\log_2 n] + 1$.

For n=8:

$C(f_n) \leq 2(2n-1)2^n + 2n \leq 2(2 \times 8-1) \times 256 + 256 = 2 \times 15 \times 256 + 256 = 30 \times 256 + 256 = 7936$ $D(f_n) \leq 2D(f_{n/2}) + 1$, where $D(f_{n/2}) \leq [\log_2 n] + 1 = 3 + 1$ $D(f_n) \leq 2 \times 4 + 1 \leq 9$ and for n=9:

$C(f_n) \leq 2(2n-1)2^n + 2n \leq 2(2 \times 9-1) \times 512 + 256 = 2 \times 17 \times 512 + 512 = 17920$ $D(f_n) \leq 2D(f_{n/2}) + 1$, where $D(f_{n/2}) \leq [\log_2 n] + 1 = 3 + 1$ $D(f_n) \leq 2 \times 4 + 1 \leq 9$.

Calculating the implementation area required for the decoder circuit for n=8 employing 0.35 CMOS technology, with each inverter requiring 2 transistors and each transistor occupying 16 square microns, the area required on the semiconductor die is 253,952 square microns. Furthermore, the depth D of the logic circuit being 9 means that propagation delays and interconnects themselves pose a difficult challenge. It should be noted that it is not possible to use wafer level fabrication technology which provides smaller transistors as the output voltage constraints the minimum feature size and therefore limits the technology which can be used for transistor fabrication.

Similarly, to understand the complexity related to DPWM control circuits as described above, it should be noted that each DPWM control circuit requires two n bit counters and gates. Each counter requires 80*n and 3*n gates for a total of 83n transistors. For n=8 and 16 sq. microns per transistor, the implementation area required on the semiconductor circuit die is 10,624 sq. microns per DPWM circuit. A different method of DPWM, using delay lines, requires far more area for the delay lines, similarly constraining the density of these controlled current driver circuits on one semiconductor circuit die.

An application where devices to be driven are arranged in a dense array is known from international patent application publication WO2010/130051, published 18 Nov. 2010. As illustrated in FIG. 4 therein, LED devices 204 are driven from drivers in an electronic component 406. The array of LEDs 514 provides a light source for a scanning print head, as shown in FIG. 5. Arranging controllable constant current supply circuits in the area surrounding each connector pad 402 is a problem for the reasons described above.

SUMMARY

As the device implementation area is limited in a number of applications, present practices cannot work. The density of controllable current driver circuits which can be integrated in one monolithic semiconductor die is limited by the number of transistors required to implement the design of the devices or as in DPWM density is prohibited by circuit switching noise.

For example, for implementing high density arrays of 128 controlled components (micro Light Emitting Diode (microLED)) described in the detailed explanation hereinbelow, the maximum size of the semiconductor die on which controlled current driver circuits are implemented is 4.5 mm by 3 mm.

The 3 mm side is constrained by trace routing considerations and only 53 DAC unit transistor array current driver circuits can be accommodated. As other circuits are required for input and storage of the input control bits, additional circuit implementation area is needed for internal interconnects. The practical limit of the density of the current driver circuits is reduced down to less than 32. Therefore, this method cannot provide the 128 driver circuits required. With reference to the complexity equations above, when n increases by 1 from 8 to 9, the number of such current driver circuits which can be accommodated on the same die reduces to less than 10.

For a 4.5 by 3 mm control circuit die, it is possible to have a greater number of DPWM current control circuits, however the noise generated prohibits implementing a large number of DPWM current control circuits on the same die. The noise is the noise generated when the gates are switched. As all the gates and transistors switch on every pulse and within pulses for the PWM control to work, switching noise prohibits large DPWM circuit density on one integrated circuit. DPWM circuits also use far more energy as switching requires energy.

In accordance with the proposed solution, large savings in circuit implementation area is proposed by employing external control logic.

Reducing the complexity of the decoding circuit is proposed by providing a weighted transistor array such that only the selection of the n bits is required, moving the complexity from integrated logic circuits to external software or other means that do not require implementation area on the semiconductor die. In some implementations the control logic can be provided in firmware.

Therefore, a larger number of component drivers can be accommodated per unit implementation area making it possible to achieve component densities not available before.

BRIEF DESCRIPTION OF THE DRAWINGS

The proposed solution will be better understood by way of the following detailed description of embodiments of the invention with reference to the appended drawings, in which.

DETAILED DESCRIPTION

Figure 1:
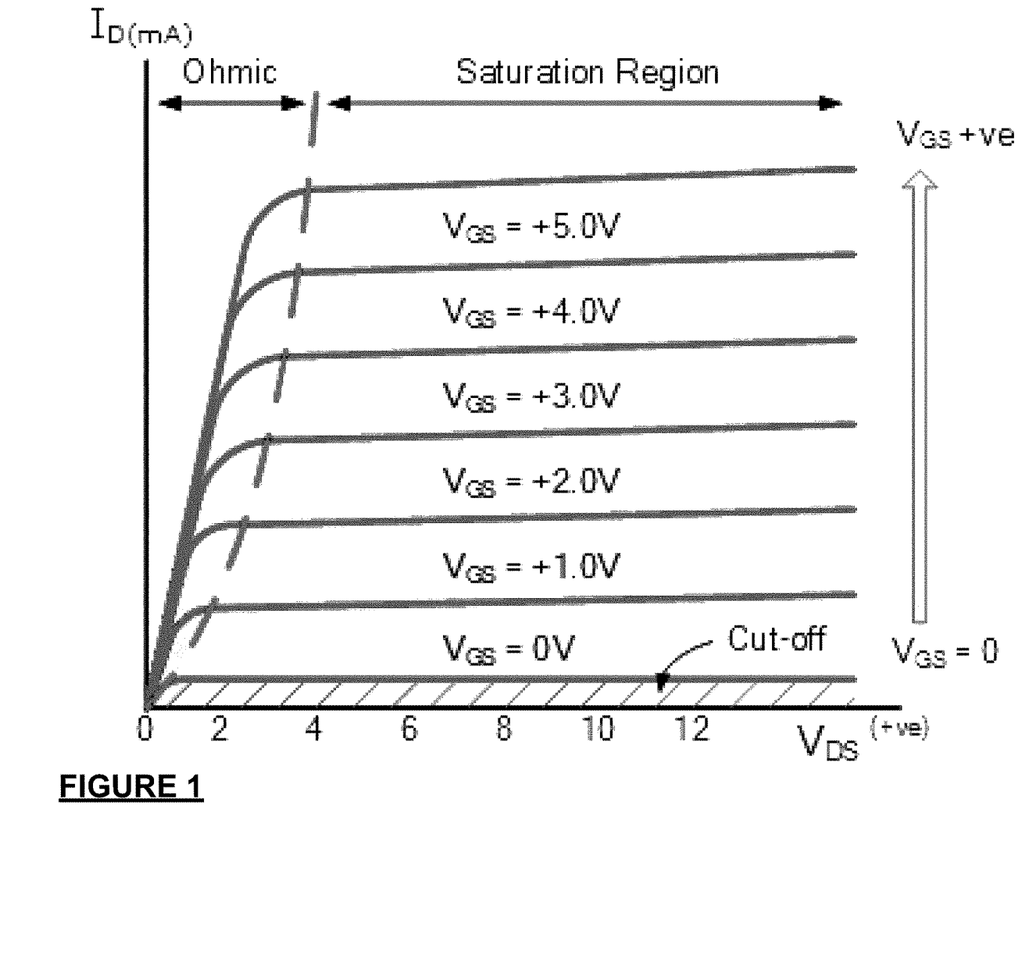
FIG. 1 is a schematic plot illustrating MOSFET transistor Current vs. Voltage (I-V) curves.

FIG. 1 illustrates a current-voltage relationship of a Metal-Oxide-Semiconductor Field-Effect Transistor (MOSFET) showing the saturation gate voltage and constant current characteristics. A transistor fabricated in MOSFET configuration behaves as a current source by saturating the gate voltage. FIG. 1 shows this current source property of MOSFET transistors.

Figure 2:
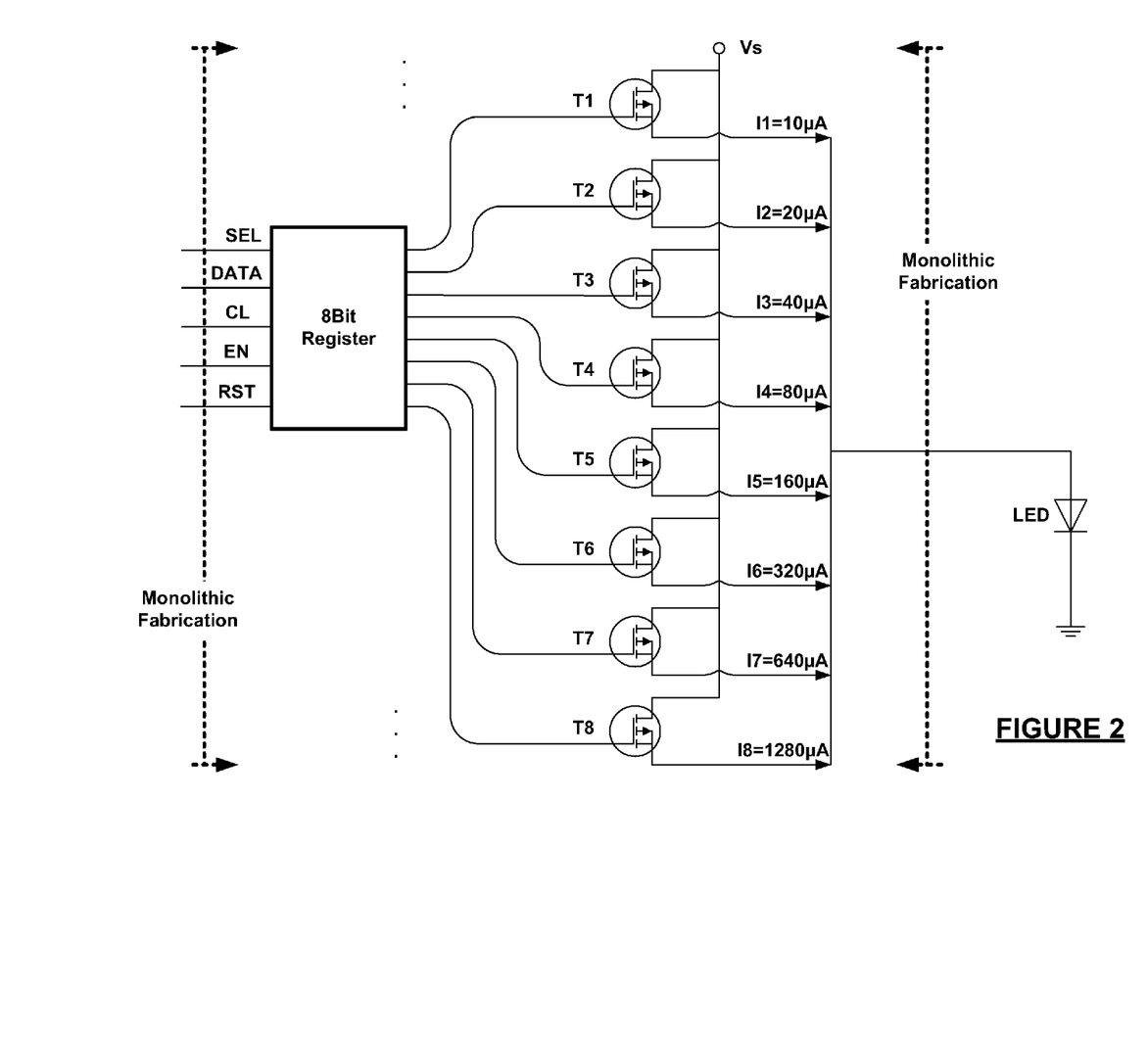
FIG. 2 is a schematic electrical diagram illustrating one of multiple monolithic weighted current drivers, implemented on a common semiconductor circuit die, delivering current with a high control resolution to a load component in accordance with the proposed solution.

As illustrated in FIG. 2, in accordance with the proposed solution, control of driving currents can be provided for multiple components by controllable current driver circuits implemented on the same semiconductor substrate employing external control logic.

There is provided an array of transistors $T_1$ to $T_n$ arranged in parallel so that all the drains are connected together and all the sources are connected together. Saturation of gate voltages is provided by outputs of a binary register.

For example, an array of n parallel transistors T1 to Tn is used to drive a corresponding component. With reference to the electronic schematic illustrated in FIG. 2, T1 has a current rating of x µA, T2 can have a current rating of 2*x µA, T3 of 2*2*x µA and Tn of 2n*x µA. Without limiting the invention thereto, an array of binary weighted transistors is thus provided.

This transistor array can be directly controlled by an n bit register. By selecting the n bit binary value, an output drive current can be selected from x to 2n*x with a resolution of x to drive the load. The current contributed by any transistor is In or 0 (zero) depending on the transistor input control bit (gate current).

For n=8, the electronic circuit schematic is illustrated in FIG. 2. The output current Io is given by:

$$Io=I1+I2+ \ldots +I8,$$

where $I8=2*I7=2*I6=2*I5=2*I4=2*I3=2*I2=2*I1$.

While FIG. 2 illustrates an electronic schematic, the process of fabricating transistors Tn with different current ratings generally includes increasing the drain and the source implementation area on the semiconductor substrate by the same factor as the difference in current. It will be appreciated that this is achievable with field-effect transistors, and is contrary to the conventional approach of connecting together the required number of unit transistors. The gate area can be the same. The current source formed by $T_1$ provides the smallest amount of constant current $I_1$ required to drive the load component. This is achieved by establishing (selecting) the size of the drain and source circuit implementation area for $T_1$ on the semiconductor substrate. Correspondingly, the drain and source area for transistor $T_2$ is selected so that the current source formed by $T_2$ has a current $I_2$, where $I_2=2*I_1$. For certainty, in this description by "implementing transistors of different drain and source area" what is meant is lithographically implementing single transistors of different source and drain areas on the same semiconductor substrate and not the prior art transistors of subtransistors (see FIG. 2 U.S. Pat. No. 3,747,088). In this way, each transistor in the array has a current source value such that:

$$I_2=2*I_1, I_3=2*I_2, \ldots I_{(n)}=2*I_{(n-1)}$$

It will be appreciated that selectively saturating gate voltages of such a transistor in the array provides a combined constant current where the value of the total current is controlled (formed) by the binary input bit values applied to the transistor gates. This is because the binary bit output voltage values of the register will ensure that corresponding transistor gate voltages are above saturation thereby ensuring each selected transistor (when ON) will act as a current source providing a constant amount of current determined by its implementation area. The total current provided by the transistor array is the sum of all currents from transistors whose gate voltages are above saturation:

$$I_0=b_1I_1+b_2I_2+ \ldots +b_n*I_n.$$

The table below illustrates output drive current values corresponding to all possible binary values of the 8 bit register where n=8 and I1=x=10 μA. The range of the current control is from 0 to 2550 μA in steps of (current control resolution) 10 μA.

| 8 bit Reg. Val. | I1 | I2 | I3 | I4 | I5 | I6 | I7 | I8 | Total Current Io |
|---|---|---|---|---|---|---|---|---|---|
| 0 | 0 | 0 | 0 | 0 | 0 | 0 | 0 | 0 | 0 |
| 1 | 1 | 0 | 0 | 0 | 0 | 0 | 0 | 0 | 10 |
| 2 | 0 | 1 | 0 | 0 | 0 | 0 | 0 | 0 | 20 |
| 3 | 1 | 1 | 0 | 0 | 0 | 0 | 0 | 0 | 30 |
| 4 | 0 | 0 | 1 | 0 | 0 | 0 | 0 | 0 | 40 |
| 5 | 1 | 0 | 1 | 0 | 0 | 0 | 0 | 0 | 50 |
| 6 | 0 | 1 | 1 | 0 | 0 | 0 | 0 | 0 | 60 |
| 7 | 1 | 1 | 1 | 0 | 0 | 0 | 0 | 0 | 70 |
| 8 | 0 | 0 | 0 | 1 | 0 | 0 | 0 | 0 | 80 |
| 9 | 1 | 0 | 0 | 1 | 0 | 0 | 0 | 0 | 90 |
| 10 | 0 | 1 | 0 | 1 | 0 | 0 | 0 | 0 | 100 |
| 11 | 1 | 1 | 0 | 1 | 0 | 0 | 0 | 0 | 110 |
| 12 | 0 | 0 | 1 | 1 | 0 | 0 | 0 | 0 | 120 |
| 13 | 1 | 0 | 1 | 1 | 0 | 0 | 0 | 0 | 130 |
| 14 | 0 | 1 | 1 | 1 | 0 | 0 | 0 | 0 | 140 |
| 15 | 1 | 1 | 1 | 1 | 0 | 0 | 0 | 0 | 150 |
| 16 | 0 | 0 | 0 | 0 | 1 | 0 | 0 | 0 | 160 |
| 17 | 1 | 0 | 0 | 0 | 1 | 0 | 0 | 0 | 170 |
| 18 | 0 | 1 | 0 | 0 | 1 | 0 | 0 | 0 | 180 |
| 19 | 1 | 1 | 0 | 0 | 1 | 0 | 0 | 0 | 190 |
| 20 | 0 | 0 | 1 | 0 | 1 | 0 | 0 | 0 | 200 |
| 21 | 1 | 0 | 1 | 0 | 1 | 0 | 0 | 0 | 210 |
| 22 | 0 | 1 | 1 | 0 | 1 | 0 | 0 | 0 | 220 |
| 23 | 1 | 1 | 1 | 0 | 1 | 0 | 0 | 0 | 230 |
| 24 | 0 | 0 | 0 | 1 | 1 | 0 | 0 | 0 | 240 |
| 25 | 1 | 0 | 0 | 1 | 1 | 0 | 0 | 0 | 250 |
| 26 | 0 | 1 | 0 | 1 | 1 | 0 | 0 | 0 | 260 |
| 27 | 1 | 1 | 0 | 1 | 1 | 0 | 0 | 0 | 270 |
| 28 | 0 | 0 | 1 | 1 | 1 | 0 | 0 | 0 | 280 |
| 29 | 1 | 0 | 1 | 1 | 1 | 0 | 0 | 0 | 290 |
| 30 | 0 | 1 | 1 | 1 | 1 | 0 | 0 | 0 | 300 |
| 31 | 1 | 1 | 1 | 1 | 1 | 0 | 0 | 0 | 310 |
| 32 | 0 | 0 | 0 | 0 | 0 | 1 | 0 | 0 | 320 |
| 33 | 1 | 0 | 0 | 0 | 0 | 1 | 0 | 0 | 330 |
| 34 | 0 | 1 | 0 | 0 | 0 | 1 | 0 | 0 | 340 |
| 35 | 1 | 1 | 0 | 0 | 0 | 1 | 0 | 0 | 350 |
| 36 | 0 | 0 | 1 | 0 | 0 | 1 | 0 | 0 | 360 |
| 37 | 1 | 0 | 1 | 0 | 0 | 1 | 0 | 0 | 370 |
| 38 | 0 | 1 | 1 | 0 | 0 | 1 | 0 | 0 | 380 |
| 39 | 1 | 1 | 1 | 0 | 0 | 1 | 0 | 0 | 390 |
| 40 | 0 | 0 | 0 | 1 | 0 | 1 | 0 | 0 | 400 |
| 41 | 1 | 0 | 0 | 1 | 0 | 1 | 0 | 0 | 410 |
| 42 | 0 | 1 | 0 | 1 | 0 | 1 | 0 | 0 | 420 |
| 43 | 1 | 1 | 0 | 1 | 0 | 1 | 0 | 0 | 430 |
| 44 | 0 | 0 | 1 | 1 | 0 | 1 | 0 | 0 | 440 |
| 45 | 1 | 0 | 1 | 1 | 0 | 1 | 0 | 0 | 450 |
| 46 | 0 | 1 | 1 | 1 | 0 | 1 | 0 | 0 | 460 |
| 47 | 1 | 1 | 1 | 1 | 0 | 1 | 0 | 0 | 470 |
| 48 | 0 | 0 | 0 | 0 | 1 | 1 | 0 | 0 | 480 |
| 49 | 1 | 0 | 0 | 0 | 1 | 1 | 0 | 0 | 490 |
| 50 | 0 | 1 | 0 | 0 | 1 | 1 | 0 | 0 | 500 |
| 51 | 1 | 1 | 0 | 0 | 1 | 1 | 0 | 0 | 510 |
| 52 | 0 | 0 | 1 | 0 | 1 | 1 | 0 | 0 | 520 |
| 53 | 1 | 0 | 1 | 0 | 1 | 1 | 0 | 0 | 530 |
| 54 | 0 | 1 | 1 | 0 | 1 | 1 | 0 | 0 | 540 |
| 55 | 1 | 1 | 1 | 0 | 1 | 1 | 0 | 0 | 550 |
| 56 | 0 | 0 | 0 | 1 | 1 | 1 | 0 | 0 | 560 |
| 57 | 1 | 0 | 0 | 1 | 1 | 1 | 0 | 0 | 570 |
| 58 | 0 | 1 | 0 | 1 | 1 | 1 | 0 | 0 | 580 |
| 59 | 1 | 1 | 0 | 1 | 1 | 1 | 0 | 0 | 590 |
| 60 | 0 | 0 | 1 | 1 | 1 | 1 | 0 | 0 | 600 |
| 61 | 1 | 0 | 1 | 1 | 1 | 1 | 0 | 0 | 610 |
| 62 | 0 | 1 | 1 | 1 | 1 | 1 | 0 | 0 | 620 |
| 63 | 1 | 1 | 1 | 1 | 1 | 1 | 0 | 0 | 630 |
| 64 | 0 | 0 | 0 | 0 | 0 | 0 | 1 | 0 | 640 |
| 65 | 1 | 0 | 0 | 0 | 0 | 0 | 1 | 0 | 650 |
| 66 | 0 | 1 | 0 | 0 | 0 | 0 | 1 | 0 | 660 |
| 67 | 1 | 1 | 0 | 0 | 0 | 0 | 1 | 0 | 670 |
| 68 | 0 | 0 | 1 | 0 | 0 | 0 | 1 | 0 | 680 |
| 69 | 1 | 0 | 1 | 0 | 0 | 0 | 1 | 0 | 690 |
| 70 | 0 | 1 | 1 | 0 | 0 | 0 | 1 | 0 | 700 |
| 71 | 1 | 1 | 1 | 0 | 0 | 0 | 1 | 0 | 710 |
| 72 | 0 | 0 | 0 | 1 | 0 | 0 | 1 | 0 | 720 |
| 73 | 1 | 0 | 0 | 1 | 0 | 0 | 1 | 0 | 730 |
| 74 | 0 | 1 | 0 | 1 | 0 | 0 | 1 | 0 | 740 |
| 75 | 1 | 1 | 0 | 1 | 0 | 0 | 1 | 0 | 750 |
| 76 | 0 | 0 | 1 | 1 | 0 | 0 | 1 | 0 | 760 |
| 77 | 1 | 0 | 1 | 1 | 0 | 0 | 1 | 0 | 770 |
| 78 | 0 | 1 | 1 | 1 | 0 | 0 | 1 | 0 | 780 |
| 79 | 1 | 1 | 1 | 1 | 0 | 0 | 1 | 0 | 790 |
| 80 | 0 | 0 | 0 | 0 | 1 | 0 | 1 | 0 | 800 |
| 81 | 1 | 0 | 0 | 0 | 1 | 0 | 1 | 0 | 810 |
| 82 | 0 | 1 | 0 | 0 | 1 | 0 | 1 | 0 | 820 |
| 83 | 1 | 1 | 0 | 0 | 1 | 0 | 1 | 0 | 830 |
| 84 | 0 | 0 | 1 | 0 | 1 | 0 | 1 | 0 | 840 |
| 85 | 1 | 0 | 1 | 0 | 1 | 0 | 1 | 0 | 850 |
| 86 | 0 | 1 | 1 | 0 | 1 | 0 | 1 | 0 | 860 |
| 87 | 1 | 1 | 1 | 0 | 1 | 0 | 1 | 0 | 870 |
| 88 | 0 | 0 | 0 | 1 | 1 | 0 | 1 | 0 | 880 |
| 89 | 1 | 0 | 0 | 1 | 1 | 0 | 1 | 0 | 890 |
| 90 | 0 | 1 | 0 | 1 | 1 | 0 | 1 | 0 | 900 |
| 91 | 1 | 1 | 0 | 1 | 1 | 0 | 1 | 0 | 910 |
| 92 | 0 | 0 | 1 | 1 | 1 | 0 | 1 | 0 | 920 |
| 93 | 1 | 0 | 1 | 1 | 1 | 0 | 1 | 0 | 930 |
| 94 | 0 | 1 | 1 | 1 | 1 | 0 | 1 | 0 | 940 |
| 95 | 1 | 1 | 1 | 1 | 1 | 0 | 1 | 0 | 950 |
| 96 | 0 | 0 | 0 | 0 | 0 | 1 | 1 | 0 | 960 |
| 97 | 1 | 0 | 0 | 0 | 0 | 1 | 1 | 0 | 970 |
| 98 | 0 | 1 | 0 | 0 | 0 | 1 | 1 | 0 | 980 |
| 99 | 1 | 1 | 0 | 0 | 0 | 1 | 1 | 0 | 990 |
| 100 | 0 | 0 | 1 | 0 | 0 | 1 | 1 | 0 | 1000 |
| 101 | 1 | 0 | 1 | 0 | 0 | 1 | 1 | 0 | 1010 |
| 102 | 0 | 1 | 1 | 0 | 0 | 1 | 1 | 0 | 1020 |
| 103 | 1 | 1 | 1 | 0 | 0 | 1 | 1 | 0 | 1030 |
| 104 | 0 | 0 | 0 | 1 | 0 | 1 | 1 | 0 | 1040 |
| 105 | 1 | 0 | 0 | 1 | 0 | 1 | 1 | 0 | 1050 |
| 106 | 0 | 1 | 0 | 1 | 0 | 1 | 1 | 0 | 1060 |
| 107 | 1 | 1 | 0 | 1 | 0 | 1 | 1 | 0 | 1070 |
| 108 | 0 | 0 | 1 | 1 | 0 | 1 | 1 | 0 | 1080 |
| 109 | 1 | 0 | 1 | 1 | 0 | 1 | 1 | 0 | 1090 |
| 110 | 0 | 1 | 1 | 1 | 0 | 1 | 1 | 0 | 1100 |
| 111 | 1 | 1 | 1 | 1 | 0 | 1 | 1 | 0 | 1110 |
| 112 | 0 | 0 | 0 | 0 | 1 | 1 | 1 | 0 | 1120 |
| 113 | 1 | 0 | 0 | 0 | 1 | 1 | 1 | 0 | 1130 |
| 114 | 0 | 1 | 0 | 0 | 1 | 1 | 1 | 0 | 1140 |
| 115 | 1 | 1 | 0 | 0 | 1 | 1 | 1 | 0 | 1150 |
| 116 | 0 | 0 | 1 | 0 | 1 | 1 | 1 | 0 | 1160 |
| 117 | 1 | 0 | 1 | 0 | 1 | 1 | 1 | 0 | 1170 |
| 118 | 0 | 1 | 1 | 0 | 1 | 1 | 1 | 0 | 1180 |
| 119 | 1 | 1 | 1 | 0 | 1 | 1 | 1 | 0 | 1190 |
| 120 | 0 | 0 | 0 | 1 | 1 | 1 | 1 | 0 | 1200 |
| 121 | 1 | 0 | 0 | 1 | 1 | 1 | 1 | 0 | 1210 |
| 122 | 0 | 1 | 0 | 1 | 1 | 1 | 1 | 0 | 1220 |
| 123 | 1 | 1 | 0 | 1 | 1 | 1 | 1 | 0 | 1230 |
| 124 | 0 | 0 | 1 | 1 | 1 | 1 | 1 | 0 | 1240 |
| 125 | 1 | 0 | 1 | 1 | 1 | 1 | 1 | 0 | 1250 |
| 126 | 0 | 1 | 1 | 1 | 1 | 1 | 1 | 0 | 1260 |
| 127 | 1 | 1 | 1 | 1 | 1 | 1 | 1 | 0 | 1270 |
| 128 | 0 | 0 | 0 | 0 | 0 | 0 | 0 | 1 | 1280 |
| 129 | 1 | 0 | 0 | 0 | 0 | 0 | 0 | 1 | 1290 |
| 130 | 0 | 1 | 0 | 0 | 0 | 0 | 0 | 1 | 1300 |
| 131 | 1 | 1 | 0 | 0 | 0 | 0 | 0 | 1 | 1310 |
| 132 | 0 | 0 | 1 | 0 | 0 | 0 | 0 | 1 | 1320 |
| 133 | 1 | 0 | 1 | 0 | 0 | 0 | 0 | 1 | 1330 |
| 134 | 0 | 1 | 1 | 0 | 0 | 0 | 0 | 1 | 1340 |
| 135 | 1 | 1 | 1 | 0 | 0 | 0 | 0 | 1 | 1350 |
| 136 | 0 | 0 | 0 | 1 | 0 | 0 | 0 | 1 | 1360 |
| 137 | 1 | 0 | 0 | 1 | 0 | 0 | 0 | 1 | 1370 |
| 138 | 0 | 1 | 0 | 1 | 0 | 0 | 0 | 1 | 1380 |
| 139 | 1 | 1 | 0 | 1 | 0 | 0 | 0 | 1 | 1390 |
| 140 | 0 | 0 | 1 | 1 | 0 | 0 | 0 | 1 | 1400 |
| 141 | 1 | 0 | 1 | 1 | 0 | 0 | 0 | 1 | 1410 |
| 142 | 0 | 1 | 1 | 1 | 0 | 0 | 0 | 1 | 1420 |
| 143 | 1 | 1 | 1 | 1 | 0 | 0 | 0 | 1 | 1430 |
| 144 | 0 | 0 | 0 | 0 | 1 | 0 | 0 | 1 | 1440 |
| 145 | 1 | 0 | 0 | 0 | 1 | 0 | 0 | 1 | 1450 |
| 146 | 0 | 1 | 0 | 0 | 1 | 0 | 0 | 1 | 1460 |

-continued

| 8 bit Reg. Val. | I1 | I2 | I3 | I4 | I5 | I6 | I7 | I8 | Total Current Io |
|---|---|---|---|---|---|---|---|---|---|
| 147 | 1 | 1 | 0 | 0 | 1 | 0 | 0 | 1 | 1470 |
| 148 | 0 | 0 | 1 | 0 | 1 | 0 | 0 | 1 | 1480 |
| 149 | 1 | 0 | 1 | 0 | 1 | 0 | 0 | 1 | 1490 |
| 150 | 0 | 1 | 1 | 0 | 1 | 0 | 0 | 1 | 1500 |
| 151 | 1 | 1 | 1 | 0 | 1 | 0 | 0 | 1 | 1510 |
| 152 | 0 | 0 | 0 | 1 | 1 | 0 | 0 | 1 | 1520 |
| 153 | 1 | 0 | 0 | 1 | 1 | 0 | 0 | 1 | 1530 |
| 154 | 0 | 1 | 0 | 1 | 1 | 0 | 0 | 1 | 1540 |
| 155 | 1 | 1 | 0 | 1 | 1 | 0 | 0 | 1 | 1550 |
| 156 | 0 | 0 | 1 | 1 | 1 | 0 | 0 | 1 | 1560 |
| 157 | 1 | 0 | 1 | 1 | 1 | 0 | 0 | 1 | 1570 |
| 158 | 0 | 1 | 1 | 1 | 1 | 0 | 0 | 1 | 1580 |
| 159 | 1 | 1 | 1 | 1 | 1 | 0 | 0 | 1 | 1590 |
| 160 | 0 | 0 | 0 | 0 | 0 | 1 | 0 | 1 | 1600 |
| 161 | 1 | 0 | 0 | 0 | 0 | 1 | 0 | 1 | 1610 |
| 162 | 0 | 1 | 0 | 0 | 0 | 1 | 0 | 1 | 1620 |
| 163 | 1 | 1 | 0 | 0 | 0 | 1 | 0 | 1 | 1630 |
| 164 | 0 | 0 | 1 | 0 | 0 | 1 | 0 | 1 | 1640 |
| 165 | 1 | 0 | 1 | 0 | 0 | 1 | 0 | 1 | 1650 |
| 166 | 0 | 1 | 1 | 0 | 0 | 1 | 0 | 1 | 1660 |
| 167 | 1 | 1 | 1 | 0 | 0 | 1 | 0 | 1 | 1670 |
| 168 | 0 | 0 | 0 | 1 | 0 | 1 | 0 | 1 | 1680 |
| 169 | 1 | 0 | 0 | 1 | 0 | 1 | 0 | 1 | 1690 |
| 170 | 0 | 1 | 0 | 1 | 0 | 1 | 0 | 1 | 1700 |
| 171 | 1 | 1 | 0 | 1 | 0 | 1 | 0 | 1 | 1710 |
| 172 | 0 | 0 | 1 | 1 | 0 | 1 | 0 | 1 | 1720 |
| 173 | 1 | 0 | 1 | 1 | 0 | 1 | 0 | 1 | 1730 |
| 174 | 0 | 1 | 1 | 1 | 0 | 1 | 0 | 1 | 1740 |
| 175 | 1 | 1 | 1 | 1 | 0 | 1 | 0 | 1 | 1750 |
| 176 | 0 | 0 | 0 | 0 | 1 | 1 | 0 | 1 | 1760 |
| 177 | 1 | 0 | 0 | 0 | 1 | 1 | 0 | 1 | 1770 |
| 178 | 0 | 1 | 0 | 0 | 1 | 1 | 0 | 1 | 1780 |
| 179 | 1 | 1 | 0 | 0 | 1 | 1 | 0 | 1 | 1790 |
| 180 | 0 | 0 | 1 | 0 | 1 | 1 | 0 | 1 | 1800 |
| 181 | 1 | 0 | 1 | 0 | 1 | 1 | 0 | 1 | 1810 |
| 182 | 0 | 1 | 1 | 0 | 1 | 1 | 0 | 1 | 1820 |
| 183 | 1 | 1 | 1 | 0 | 1 | 1 | 0 | 1 | 1830 |
| 184 | 0 | 0 | 0 | 1 | 1 | 1 | 0 | 1 | 1840 |
| 185 | 1 | 0 | 0 | 1 | 1 | 1 | 0 | 1 | 1850 |
| 186 | 0 | 1 | 0 | 1 | 1 | 1 | 0 | 1 | 1860 |
| 187 | 1 | 1 | 0 | 1 | 1 | 1 | 0 | 1 | 1870 |
| 188 | 0 | 0 | 1 | 1 | 1 | 1 | 0 | 1 | 1880 |
| 189 | 1 | 0 | 1 | 1 | 1 | 1 | 0 | 1 | 1890 |
| 190 | 0 | 1 | 1 | 1 | 1 | 1 | 0 | 1 | 1900 |
| 191 | 1 | 1 | 1 | 1 | 1 | 1 | 0 | 1 | 1910 |
| 192 | 0 | 0 | 0 | 0 | 0 | 0 | 1 | 1 | 1920 |
| 193 | 1 | 0 | 0 | 0 | 0 | 0 | 1 | 1 | 1930 |
| 194 | 0 | 1 | 0 | 0 | 0 | 0 | 1 | 1 | 1940 |
| 195 | 1 | 1 | 0 | 0 | 0 | 0 | 1 | 1 | 1950 |
| 196 | 0 | 0 | 1 | 0 | 0 | 0 | 1 | 1 | 1960 |
| 197 | 1 | 0 | 1 | 0 | 0 | 0 | 1 | 1 | 1970 |
| 198 | 0 | 1 | 1 | 0 | 0 | 0 | 1 | 1 | 1980 |
| 199 | 1 | 1 | 1 | 0 | 0 | 0 | 1 | 1 | 1990 |
| 200 | 0 | 0 | 0 | 1 | 0 | 0 | 1 | 1 | 2000 |
| 201 | 1 | 0 | 0 | 1 | 0 | 0 | 1 | 1 | 2010 |
| 202 | 0 | 1 | 0 | 1 | 0 | 0 | 1 | 1 | 2020 |
| 203 | 1 | 1 | 0 | 1 | 0 | 0 | 1 | 1 | 2030 |
| 204 | 0 | 0 | 1 | 1 | 0 | 0 | 1 | 1 | 2040 |
| 205 | 1 | 0 | 1 | 1 | 0 | 0 | 1 | 1 | 2050 |
| 206 | 0 | 1 | 1 | 1 | 0 | 0 | 1 | 1 | 2060 |
| 207 | 1 | 1 | 1 | 1 | 0 | 0 | 1 | 1 | 2070 |
| 208 | 0 | 0 | 0 | 0 | 1 | 0 | 1 | 1 | 2080 |
| 209 | 1 | 0 | 0 | 0 | 1 | 0 | 1 | 1 | 2090 |
| 210 | 0 | 1 | 0 | 0 | 1 | 0 | 1 | 1 | 2100 |
| 211 | 1 | 1 | 0 | 0 | 1 | 0 | 1 | 1 | 2110 |
| 212 | 0 | 0 | 1 | 0 | 1 | 0 | 1 | 1 | 2120 |
| 213 | 1 | 0 | 1 | 0 | 1 | 0 | 1 | 1 | 2130 |
| 214 | 0 | 1 | 1 | 0 | 1 | 0 | 1 | 1 | 2140 |
| 215 | 1 | 1 | 1 | 0 | 1 | 0 | 1 | 1 | 2150 |
| 216 | 0 | 0 | 0 | 1 | 1 | 0 | 1 | 1 | 2160 |
| 217 | 1 | 0 | 0 | 1 | 1 | 0 | 1 | 1 | 2170 |
| 218 | 0 | 1 | 0 | 1 | 1 | 0 | 1 | 1 | 2180 |
| 219 | 1 | 1 | 0 | 1 | 1 | 0 | 1 | 1 | 2190 |
| 220 | 0 | 0 | 1 | 1 | 1 | 0 | 1 | 1 | 2200 |
| 221 | 1 | 0 | 1 | 1 | 1 | 0 | 1 | 1 | 2210 |
| 222 | 0 | 1 | 1 | 1 | 1 | 0 | 1 | 1 | 2220 |
| 223 | 1 | 1 | 1 | 1 | 1 | 0 | 1 | 1 | 2230 |
| 224 | 0 | 0 | 0 | 0 | 0 | 1 | 1 | 1 | 2240 |
| 225 | 1 | 0 | 0 | 0 | 0 | 1 | 1 | 1 | 2250 |
| 226 | 0 | 1 | 0 | 0 | 0 | 1 | 1 | 1 | 2260 |
| 227 | 1 | 1 | 0 | 0 | 0 | 1 | 1 | 1 | 2270 |
| 228 | 0 | 0 | 1 | 0 | 0 | 1 | 1 | 1 | 2280 |
| 229 | 1 | 0 | 1 | 0 | 0 | 1 | 1 | 1 | 2290 |
| 230 | 0 | 1 | 1 | 0 | 0 | 1 | 1 | 1 | 2300 |
| 231 | 1 | 1 | 1 | 0 | 0 | 1 | 1 | 1 | 2310 |
| 232 | 0 | 0 | 0 | 1 | 0 | 1 | 1 | 1 | 2320 |
| 233 | 1 | 0 | 0 | 1 | 0 | 1 | 1 | 1 | 2330 |
| 234 | 0 | 1 | 0 | 1 | 0 | 1 | 1 | 1 | 2340 |
| 235 | 1 | 1 | 0 | 1 | 0 | 1 | 1 | 1 | 2350 |
| 236 | 0 | 0 | 1 | 1 | 0 | 1 | 1 | 1 | 2360 |
| 237 | 1 | 0 | 1 | 1 | 0 | 1 | 1 | 1 | 2370 |
| 238 | 0 | 1 | 1 | 1 | 0 | 1 | 1 | 1 | 2380 |
| 239 | 1 | 1 | 1 | 1 | 0 | 1 | 1 | 1 | 2390 |
| 240 | 0 | 0 | 0 | 0 | 1 | 1 | 1 | 1 | 2400 |
| 241 | 1 | 0 | 0 | 0 | 1 | 1 | 1 | 1 | 2410 |
| 242 | 0 | 1 | 0 | 0 | 1 | 1 | 1 | 1 | 2420 |
| 243 | 1 | 1 | 0 | 0 | 1 | 1 | 1 | 1 | 2430 |
| 244 | 0 | 0 | 1 | 0 | 1 | 1 | 1 | 1 | 2440 |
| 245 | 1 | 0 | 1 | 0 | 1 | 1 | 1 | 1 | 2450 |
| 246 | 0 | 1 | 1 | 0 | 1 | 1 | 1 | 1 | 2460 |
| 247 | 1 | 1 | 1 | 0 | 1 | 1 | 1 | 1 | 2470 |
| 248 | 0 | 0 | 0 | 1 | 1 | 1 | 1 | 1 | 2480 |
| 249 | 1 | 0 | 0 | 1 | 1 | 1 | 1 | 1 | 2490 |
| 250 | 0 | 1 | 0 | 1 | 1 | 1 | 1 | 1 | 2500 |
| 251 | 1 | 1 | 0 | 1 | 1 | 1 | 1 | 1 | 2510 |
| 252 | 0 | 0 | 1 | 1 | 1 | 1 | 1 | 1 | 2520 |
| 253 | 1 | 0 | 1 | 1 | 1 | 1 | 1 | 1 | 2530 |
| 254 | 0 | 1 | 1 | 1 | 1 | 1 | 1 | 1 | 2540 |
| 255 | 1 | 1 | 1 | 1 | 1 | 1 | 1 | 1 | 2550 |

Figure 3:
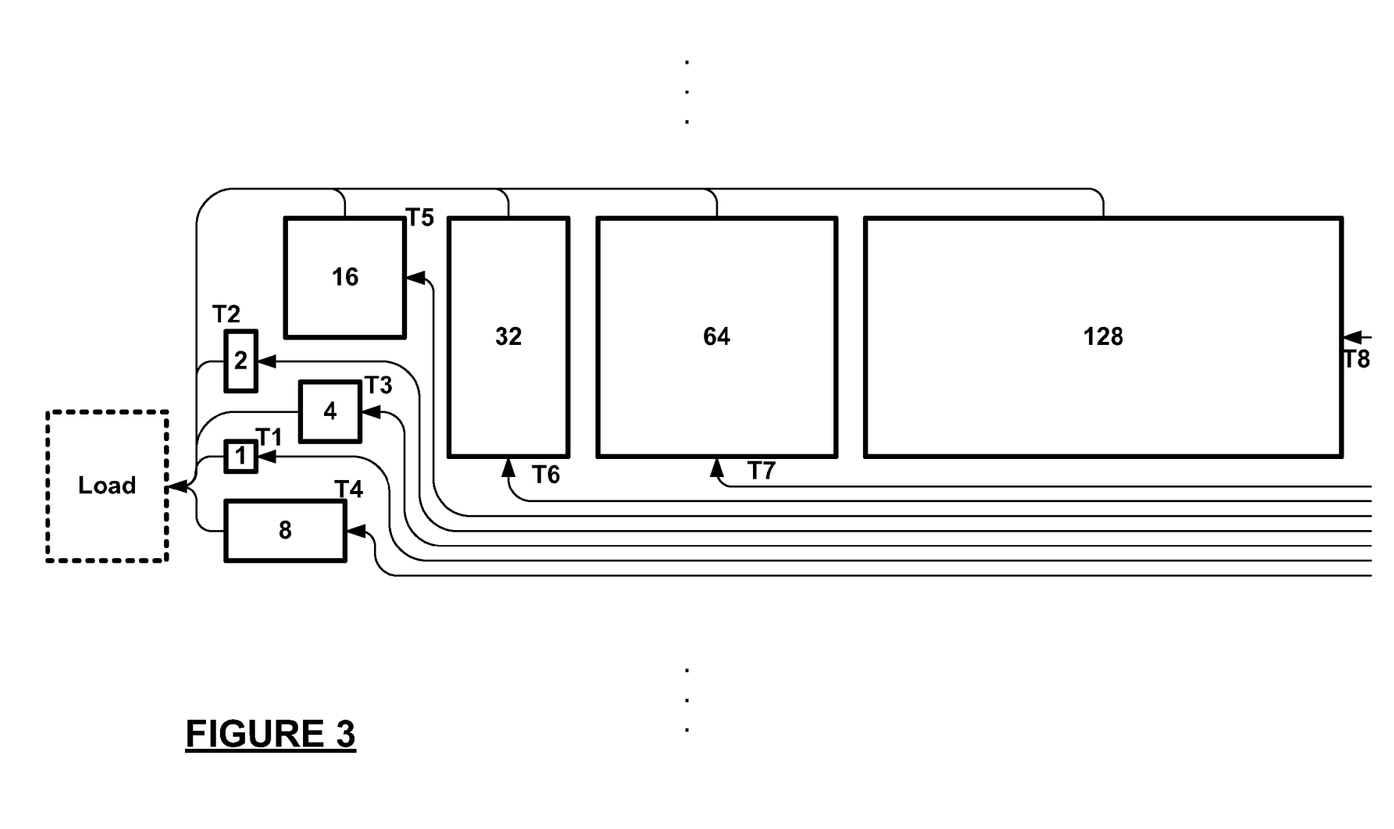
FIG. 3 is a schematic diagram illustrating a schematic implementation detail of a current driver providing high control resolution in accordance with the proposed solution.

FIG. 3 schematically illustrates a general layout and interconnection of binary weighted transistors $T_x$ (x=1 to n) on a semiconductor substrate in accordance with an implementation of the proposed solution. Each transistor Tn is illustrated in 2n area proportion to the other transistors. For certainty, and without limiting the invention, FIG. 3 is a highly schematic layout diagram, for example the transistors Tn may not be shown in exact proportion to circuit trace lengths or circuit trace widths. Additional circuit traces may be required as understood by a person of skill in the art with appropriate spacing provisions and/or grounding to reduce arcing.

As illustrated in FIG. 3, the transistor control traces may not be connected to the pattern of transistors in the binary bit sequence illustrated in the above table and schematically in FIG. 2. In this context, the bit register provides a bit sequence pattern different from the mathematical binary bit sequence pattern (order of the table columns hereinabove), however the total sum of currents for the current level Io to be delivered to the load is the same. Employing transistors $T_x$ having implementation areas generally corresponding to the binary progression employs a unique control bit pattern.

Figure 4:
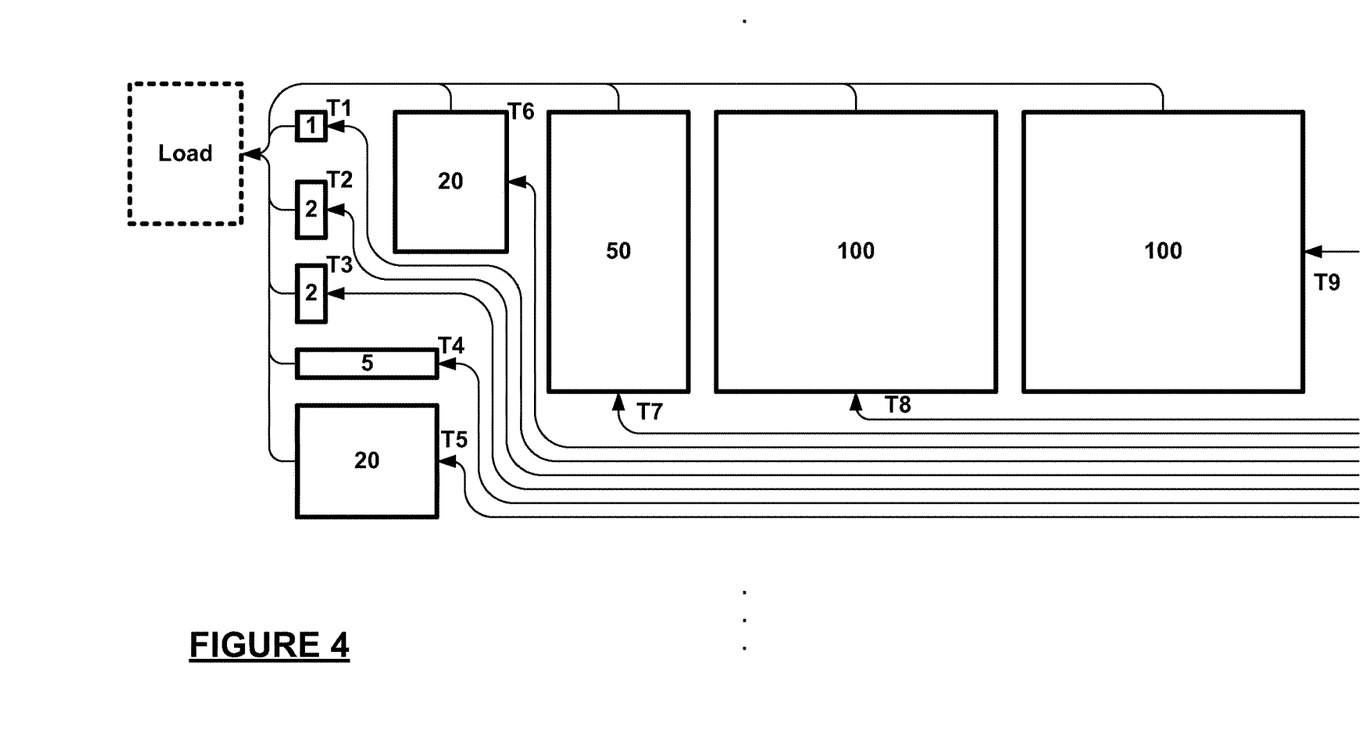
FIG. 4 is another schematic diagram illustrating a schematic implementation detail of a current driver providing high control resolution in accordance with the proposed solution.

For certainty, the invention is not limited to delivering driving currents to the load component in a unique progression and/or via a unique bit pattern. At least some of the above mentioned considerations can be addressed by employing a different multitude of transistors Tn not necessarily having unique implementation areas on the semiconductor substrate. FIG. 4 illustrates a schematic layout detail of another controllable current driver circuit implemented on a semiconductor substrate. The transistor implementation areas do not follow a binary progression, with some transistors Tn for example having similar implementation areas on the substrate. Transistor implementation areas on the substrate are illustrated in proportion with factor x=1. For n=9, higher current control resolution (700 current steps) than illustrated in the table above can be provided by employing different, not necessarily unique, bit patterns to actuate the transistors Tn, control bit pattern which is decoupled from implementation pattern consideration of the controllable current driver circuit on the substrate.

More generally, the external current driver control logic provides an input transistor actuation pattern to command specific transistors $T_x$ on or off.

In accordance with the proposed solution, a correspondence table between current control steps and transistor actuation bit patterns is preferably implemented in external current driver control logic. The external current driver control logic can be implemented in firmware/software employing coded logic steps executed by a microchip to provide the control transistor actuation bit pattern.

The transistor array with n inputs can be controlled directly by a n bit register. No further integrated circuit logic is required. This control capability provides a significant improvement in the density of the controllable current driver circuits that can be integrated on one semiconductor die.

Figure 5:
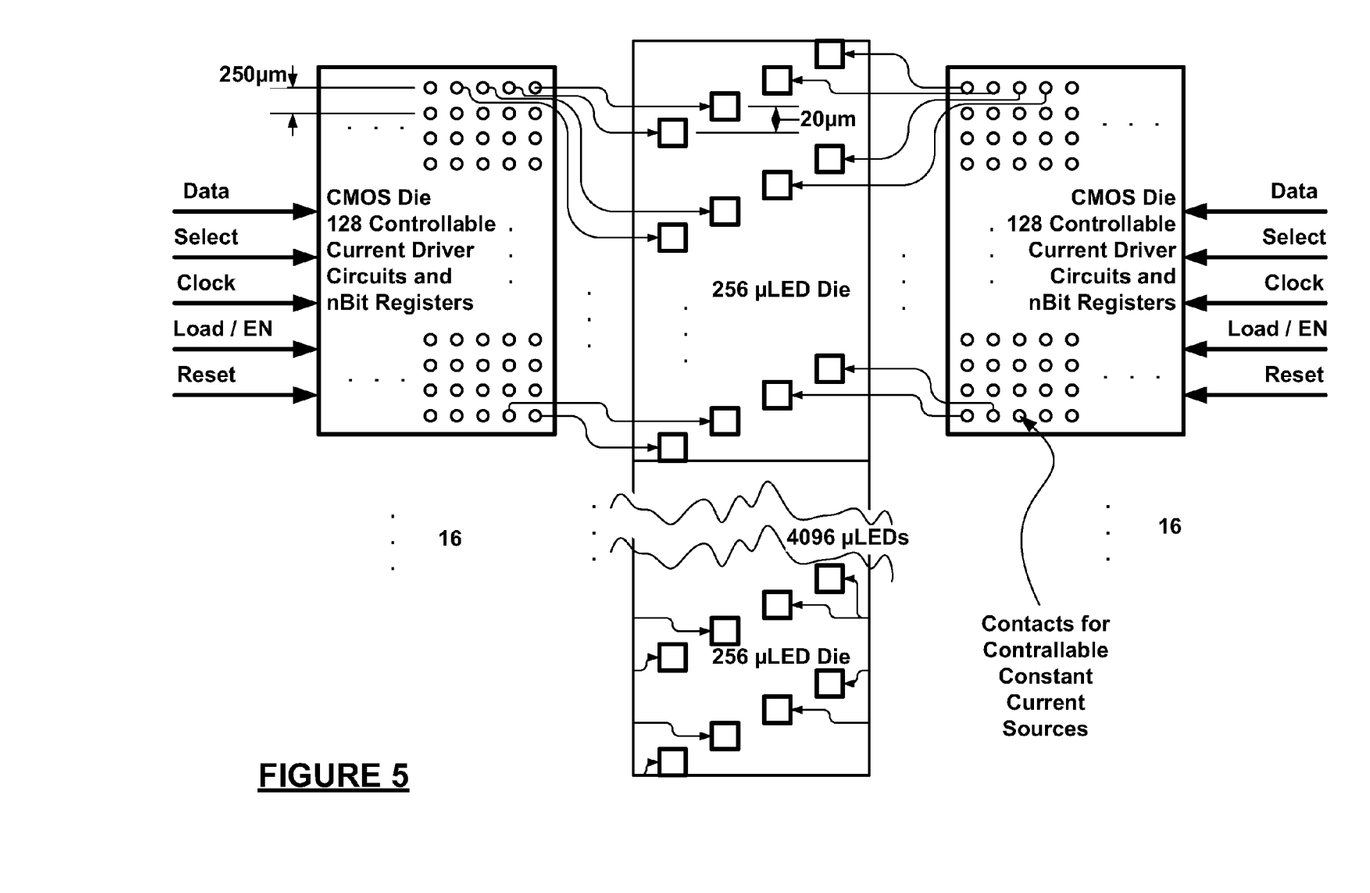
FIG. 5 is a schematic diagram illustrating a high density component array driven by monolithic controllable current drivers in accordance with an implementation of the proposed solution, wherein similar features bear similar labels throughout the drawings.

With the bit register also fabricated on the same semiconductor die, external connectivity to current driver control logic circuitry can be reduced from the n individual transistor control lines. For example, external control lines can be reduced to: register SELect, serial DATA, Clock, ENable and RESet as generally illustrated in FIG. 2. Power and ground lines are not illustrated as these can be common to all bit registers on the semiconductor die. The bit registers can be combined to have a n*y word width with the same DATA, SEL CL, EN, RES control lines controlling y load components in the array at the same time. Such controllable current driver circuits can be implemented to control 128 load components on a single semiconductor die while employing about 6 wire external contacts as illustrated in FIG. 5. The n bit register, illustrated in FIG. 2, can be filled by transferring the contents of a shift register that is filled by an external source by shifting the desired n bit data pattern in to the shift register.

The importance of the proposed solution in solving the problem of high density controllable constant current sources can be seen in the application of the proposed solution to driving high density arrays of micro LEDs (Light Emitting Diodes).

Micro LEDs are very small. Devices employing micro LEDs have numerous applications in communications, health sciences and lithography. Some of these applications require arrays of micro LEDs. Lithography, specifically lithography for the production of printed circuit boards, thin films, thick films and MEMS require very large arrays of micro LEDs. These arrays have to be very dense to provide high pixel density, accuracy and resolution of lithography (images). For example, without limiting the invention, the microLED components can preferably be implemented on a GaN semiconductor substrate. For example, a specific application requires an array of 4096 20 µm LEDs arranged in a manner that, when combined with appropriate hardware and other related systems permit creation of images on photo resists for the production of the above mentioned components (printed circuit boards). The linear array illustrated is configured to employ staggered microLED components to reduce light spillover between adjacent microLEDs through the substrate. Such an array of micro LEDs can produce contiguous images at 200 dots per mm (50580 dpi). This requires reduction optics of 4× producing pixels of 5 µm at a pitch of 5 µm. The micro LEDs require constant current to operate and this constant current is different for different photo resists, as well as the LEDs themselves may not be equal in radiation to each other due to manufacturing errors (within tolerances). For both these reasons it is necessary to have an individual controllable constant current source for each micro LED.

Miniaturization of printing heads is very important as, desirably, increasing print pixel pitch resolution is dependent on increasing printing component density in such arrays. Fine control of microLED components in print head devices is also very important, desirably, increasing control resolution, in terms luminosity, provides improved contrast for increased print resolution in terms of discrete discernable lines per unit length.

Monolithic linear arrays of 256 microLED can be provided on a single semiconductor die. The density of such micro LEDs implemented on a monolithic semiconductor substrate is 50 micro LEDs per mm. The geometry of the overall device requires the controllable current drive sources to have the same pitch or less. This arrangement of micro LEDs and current drivers forces the routing of conductor traces for driving individual micro LED devices in the array to a space of 20 µm. Delivering a current of 1 mA, required to operate each micro LED, requires a conductor of 10 µm. A 10 µm space is required between circuit traces to avoid arcing between conductors at a forward drop of 7V and a safety margin of 3V. This demands that the controllable constant current drivers must be spaced at the same pitch, or failing which, they must be arranged so that such density of connections is possible.

Standard CMOS integrated circuit technology can be very dense, however practical density is also limited by the operating voltage and current requirements as detailed hereinabove. This limits the CMOS technology to 0.35 µm feature size. The impact of this restriction is that the controllable constant current sources must require very small circuit implementation area on the CMOS semiconductor die.

In accordance with one implementation of the proposed solution, each monolithic array of 256 microLEDs is controlled by 128 groups of weighted transistor controllable current drivers circuits on each side of the linear array. FIG. 5 illustrates portions of such a monolithic micro LED array with separate monolithic controllable constant current source driver circuits implemented in a CMOS die, one CMOS die on each side of the micro LED array.

The micro LEDs are shown having a 20 micron pitch and the CMOS die provides current drive conductors at the same pitch. Elongating the CMOS die in the direction orthogonal to the micro LED array will not help improve connectivity or current driver density as the pitch of the micro LEDs will not change. If the CMOS dies are staggered to access a larger area for the CMOS dies, the conductor trace lengths will become imbalanced and the forward drop across the micro LEDs will change as a common voltage source is employed.

Each current driver semiconductor die is 4 mm in width and contains 128 controllable current driver circuits monolithically implemented thereon, providing a match for the density of the micro LEDs array. The overall micro LED array of 4096 micro LEDs is driven by 32 current driver dies arranged in two columns, one on each side.

The CMOS technology provides contact pads on the die which are 50 µm in diameter and having at least a 100 µm pitch, the limit of present technology for the current and voltage requirements to drive the micro LEDs. Therefore only one conductor can pass between each vertical contact of the CMOS die making the required density impossible. Employing a 250 µm space between the pad contacts allows for a number of conductors to pass between the vertical contacts of the CMOS die. This arrangement allows for 128 contacts and the conductor routing to make the connections at the required density. Without the reduction of the decoding logic and the without implementing weighted transistor drivers on the CMOS semiconductor die it will not be possible to provide the density of controllable constant current sources and the density of connections.

As MEMS devices increase in complexity and other printing apparatus require higher density of controllable constant current sources, the solution proposed herein will allow for these devices to be appropriately controlled.

As the light emitting diodes within an array are formed simultaneously on one wafer, the light intensity to current relationship may be well within the range of variations tolerated by the applications visualized in this disclosure. Therefore to control the intensity of the light emitting diodes within one monolithic array, a programmable current source is used. The current to diodes in an array may be changed and may thus change the intensity of the diode emissions (luminosity). The drive electronics may contain storage for retaining the relationship of the current versus light intensity for the array (e.g., non-volatile electronic storage such as processor non-volatile memory that maintains its contents regardless of availability of power). According to some embodiments, controller electronics may store current to light intensity ratio data for the one or more subsets of LED devices. For example, the controller may store and utilize current to light intensity data for LED elements of an array.

Intensity control as described above may be used to generate equal intensity in two or more light emitting diode arrays used to form a dense array as described above.

Controlling the intensity of light in each individual light emitting diode element may be achieved through the use of a table of data in the non volatile memory that may be part of an embedded processor. The table of data may be built during an initial calibration period where the light intensity may be measured by an integrated power sensor (e.g., a photo-receptor) mounted in an apparatus.

To calibrate the elements of the array, each light emitting diode element may be turned on one at a time, and a reading from a power sensor may be obtained. The reading from the power sensor may then be stored in non-volatile memory. These values, one for each element, may then be used to calculate the transistor actuation bit pattern required to correct for the non-uniformity. This data may then be transferred to the appropriate control electronics so that when the light emitting diodes are switched on, they are switched off depending on this definition transferred from the non-volatile memory to the control electronics. As different photo receptors have different sensitivity to difference in intensity, one or both methods may be used to achieve the desired uniformity of light intensity.

In accordance with another implementation of the proposed solution, when only precise on/off output is required in an application, for example selectively turning micro LED components on/off however with a precise luminosity, controllable constant current sources can be implemented with higher density by implementing a transistor for providing almost all the necessary current to drive the micro LED within micro LED (i.e. a base current level) and/or controllable constant current circuit manufacturing tolerance (s), with the rest of the current being provided by a (smaller) number of preferably weighted transistors which can provide a trimming function. For example, one of the mid size transistors can be omitted from the array with a corresponding adjustment of the transistor actuation bit pattern. Without loss in control resolution, however in a reduced current control range, this provides a reduction in the transistor implementation area on the semiconductor die, a reduction in the size of the bit register and a reduction in the number of traces on the semiconductor die connecting the bit register to the weighted transistor array. The actual reduced transistor actuation bit pattern for each micro LED can be determined via calibration.

Another example of using high density monolithic controllable current sources is in the application of micro-neural electrodes in the emerging field of neuro-excitation. This emerging field of embedded neural excitation circuits requires massive component arrays of stimuli through electrodes that may be optical or electrical. Due to the necessity of miniaturization, the high density monolithic controllable current sources provide a means to minimize the physical intervention in implantation of such stimuli circuits.

While the invention has been shown and described with referenced to preferred embodiments thereof, it will be recognized by those skilled in the art that various changes in form and detail may be made therein without departing from the spirit and scope of the invention as defined by the appended claims.

What is claimed is:

1. A controllable level current source driver integrated circuit for powering a high density array of devices in which each device is to be powered by a corresponding variable level of current, said integrated circuit comprising a number of registers for providing gate signals, the integrated circuit comprising:
    a number of controllable current sources provided on an integrated circuit associated with the high density array of devices, each controllable current source corresponding to a device of said high density array of devices,
    said current sources each having at least 8 weighted field-effect transistors connected for combined constant current output and controlled directly by gate signals provided by an output of one of said registers defining a variable level of current to be supplied by said current source, wherein said field-effect transistors have source and drain areas proportional to their corresponding weighted current values.

2. The integrated circuit as defined in claim 1, wherein the weighted current values are binary weighted.

3. The integrated circuit as defined in claim 2, wherein the current sources provide at least 256 levels of current.

4. The integrated circuit as defined in claim 1, wherein the current sources provide at least 256 levels of current.

5. A print head comprising:
    one or more high density arrays of LEDs each provided on a substrate;
    one or more controllable level current source driver integrated circuits as defined in claim 1 for driving said LEDs.

6. The print head as defined in claim 5, further comprising control logic connected to said registers configured to determine a binary state of said gate signals of a number of said LEDs.

7. The print head as defined in claim 6, wherein each of said controllable current sources is configured to provide current control in approximately 10 µA steps.

8. The print head as defined in claim 5, wherein each of said controllable current sources is configured to provide current control in approximately 10 μA steps.

9. A method of manufacturing a printed circuit board comprising:
exposing a photosensitive surface of a printed circuit board using a print head as defined in claim 5.

10. The method as defined in claim 9, wherein said exposing comprises setting an intensity of said LEDs to have one of a number of current levels exceeding 255 levels.

11. A controllable level current source driver for powering a high density array of light emitting devices in which each device is to be powered by a corresponding variable level of current, the controllable level current source driver comprising:
a semiconductor die;
a number of controllable current sources provided in said semiconductor die, each controllable current source having an output corresponding to a device of said high density array of light emitting devices,
a number of registers provided in said semiconductor die for providing gate signals, said number of registers being arranged as a shift register;
external control lines for setting a bit value of said number of registers using shifting of a bit data pattern, said external control lines provided in said die;
said current sources each having at least 8 weighted field-effect transistors connected for combined constant current output and controlled directly by gate signals provided by an output of one of said registers defining a variable level of current to be supplied by said current source, wherein said field-effect transistors have source and drain areas proportional to their corresponding weighted current values.

12. The controllable level current source driver as defined in claim 11, wherein said output of current sources comprise contact pads on said semiconductor die.

13. The integrated circuit as defined in claim 11, wherein the current sources provide at least 256 levels of current.

14. A print head comprising:
one or more high density arrays of LEDs each provided on a substrate;
one or more controllable level current source driver integrated circuits as defined in claim 11 for driving said LEDs.

15. The print head as defined in claim 14, further comprising control logic connected to said registers configured to determine a binary state of said gate signals of a number of said LEDs.

16. The print head as defined in claim 15, wherein each of said controllable current sources is configured to provide current control in approximately 10 μA steps.

17. The print head as defined in claim 14, wherein each of said controllable current sources is configured to provide current control in approximately 10 μA steps.

18. A method of manufacturing a printed circuit board comprising:
exposing a photosensitive surface of a printed circuit board using a print head as defined in claim 14.

19. The method as defined in claim 18, wherein said exposing comprises setting an intensity of said LEDs to have one of a number of current levels exceeding 255 levels.

* * * * *